United States Patent
Kaza et al.

(10) Patent No.: US 7,450,416 B1
(45) Date of Patent: Nov. 11, 2008

(54) UTILIZATION OF MEMORY-DIODE WHICH MAY HAVE EACH OF A PLURALITY OF DIFFERENT MEMORY STATES

(75) Inventors: Swaroop Kaza, Woburn, MA (US); Juri Krieger, Brookline, MA (US); David Gaun, Brookline, MA (US); Stuart Spitzer, Lynnfield, MA (US); Richard Kingsborough, Acton, MA (US); Zhida Lan, Cupertino, CA (US); Colin S. Bill, Cupertino, CA (US); Wei Daisy Cai, Fremont, CA (US); Igor Sokolik, East Boston, MA (US)

(73) Assignee: Spansion LLC, Sunnyvale, CA (US)

( * ) Notice: Subject to any disclaimer, the term of this patent is extended or adjusted under 35 U.S.C. 154(b) by 324 days.

(21) Appl. No.: 11/021,944

(22) Filed: Dec. 23, 2004

(51) Int. Cl.
*G11C 11/34* (2006.01)

(52) U.S. Cl. .......................... 365/175; 365/184; 365/243

(58) Field of Classification Search ................. 365/175, 365/184, 243, 105, 185.24; 257/594, 910, 257/104, 316, 295–296
See application file for complete search history.

(56) References Cited

U.S. PATENT DOCUMENTS

| | | | | | |
|---|---|---|---|---|---|
| 3,922,648 | A | * | 11/1975 | Buckley | 365/163 |
| 4,459,686 | A | * | 7/1984 | Toyoda | 365/201 |
| 5,438,539 | A | * | 8/1995 | Mori | 365/159 |
| 5,491,657 | A | * | 2/1996 | Haddad et al. | 365/185.27 |
| 5,691,935 | A | * | 11/1997 | Douglass | 365/149 |
| 5,737,259 | A | * | 4/1998 | Chang | 365/105 |
| 5,745,407 | A | * | 4/1998 | Levy et al. | 365/159 |
| 6,930,906 | B2 | * | 8/2005 | Matsushita et al. | 365/145 |
| 7,027,327 | B2 | * | 4/2006 | Yamamoto et al. | 365/184 |
| 7,035,141 | B1 | * | 4/2006 | Tripsas et al. | 365/175 |
| 7,157,732 | B2 | * | 1/2007 | Krieger et al. | 257/40 |
| 2004/0100835 | A1 | * | 5/2004 | Sugibayashi et al. | 365/200 |
| 2006/0139994 | A1 | * | 6/2006 | Bill et al. | 365/175 |

* cited by examiner

*Primary Examiner*—David Lam

(57) ABSTRACT

The present invention is a method of undertaking a procedure on a memory-diode, wherein a memory-diode is provided which is programmable so as to have each of a plurality of different threshold voltages. A reading of the state of the memory-diode indicates the so determined threshold voltage of the memory-diode.

37 Claims, 14 Drawing Sheets

UTILIZATION OF MEMORY-DIODE WHICH MAY HAVE EACH OF A PLURALITY OF DIFFERENT MEMORY STATES

BACKGROUND OF THE INVENTION

1. Technical Field

This invention relates generally to memory devices, and more particularly, to a memory structure incorporating memory-diodes.

2. Background Art

Generally, memory devices associated with computers and other electronic devices are employed to store and maintain information for the operation thereof. Typically, such a memory device includes an array of memory cells, wherein each memory cell can be accessed for programming, erasing, and reading thereof. Each memory cell maintains information in an "off" state or an "on" state, also referred to as "0" and "1" respectively, which can be read during the reading step of that memory cell.

As such electronic devices continue to be developed and improved, the amount of information required to be stored and maintained continues to increase. FIG. 1 illustrates a type of memory cell known as a memory-diode 30, which includes advantageous characteristics for meeting these needs. The memory-diode 30 includes, for example, an electrode 32, a superionic layer 34 on the electrode 32, an active layer 36 on the superionic layer 34, and an electrode 38 on the active layer 36. Initially, assuming that the memory-diode 30 is unprogrammed, in order to program the memory-diode 30, a negative voltage is applied to the electrode 38, while the electrode 32 is held at ground, so that an electrical potential $V_{pg}$ (the "programming" electrical potential) is applied across the memory-diode 30 from a higher to a lower electrical potential in the forward direction of the memory-diode 30 (see FIG. 2, a plot of memory-diode current vs. electrical potential applied across the memory-diode 30). This potential is sufficient to cause copper ions to be attracted from the superionic layer the 34 toward the electrode 38 and into the active layer 36 (A), causing the active layer 36 (and the overall memory-diode 30) to be in a (forward) low-resistance or conductive state. Upon removal of such potential (B), the copper ions drawn into the active layer 36 during the programming step remain therein, so that the active layer 36 (and memory-diode 30) remain in a conductive or low-resistance state.

FIG. 3 illustrates the read step of the memory-diode 30 in its programmed (conductive) state. An electrical potential $V_r$ (the "read" electrical potential) is applied across the memory-diode 30 from a higher to a lower electrical potential in the forward direction of the memory-diode 30. This electrical potential is sufficient to overcome the threshold voltage $V_t$ of the inherent diode characteristic of the memory-diode 30, but is less than the electrical potential $V_{pg}$ applied across the memory-diode 30 for programming (see above). In this situation, the memory-diode 30 will readily conduct current, which indicates that the memory-diode 30 is in its programmed state.

In order to erase the memory-diode (FIG. 4), a positive voltage is applied to the electrode 38, while the electrode 32 is held at ground, so that an electrical potential $V_{er}$ (the "erase" electrical potential) is applied across the memory-diode 30 from a higher to a lower electrical potential in the reverse direction of the memory-diode 30. This potential is sufficient to cause copper ions to be repelled from the active layer 36 toward the electrode 32 and into the superionic layer 34, causing the active layer 36 (and the overall memory-diode 30) to be in a high-resistance or substantially non-conductive state (see FIG. 5, illustrating application of electrical potential $V_{er}$ across the memory-diode 30). This state remains upon removal of such potential from the memory-diode 30.

FIG. 6 illustrates the read step of the memory-diode 30 in its erased (substantially non-conductive) state. The electrical potential $V_r$ is again applied across the memory-diode 30 from a higher to a lower electrical potential in the forward direction of the memory-diode 30, as described above. With the active layer 34 (and memory-diode 30) in a high-resistance or substantially non-conductive state, the memory-diode 30 will not conduct significant current, which indicates that the memory-diode 30 is in its erased state.

As will be seen, the memory-diode as thus far shown and described is capable of adopting two states, i.e., a first, conductive state, or "on" state, and a second, substantially non-conductive, or "off" state. Each memory-diode thus can include information as to the state of a single bit, i.e., either 0 or 1. However, it would be highly desirable to be able to provide a memory-diode which is capable of adopting each of a plurality of states, so that, for example, in the case where four different states of the memory-diode can be adopted, two bits of information can be provided as chosen (for example first state equals 00, second stage equals 01, third state equals 10, fourth state equals 11).

Therefore, what is needed is an approach wherein a memory-diode may adopt each of a plurality of states, each relating to the information held thereby.

DISCLOSURE OF THE INVENTION

Broadly stated, the present invention is a method of undertaking a procedure on a memory-diode comprising providing a memory-diode which is capable of being programmed to have each of a plurality of different threshold voltages, and providing that reading of the state of the memory-diode indicates the so-determined threshold voltage of the memory-diode.

The present invention further also comprises a memory array comprising a first plurality of conductors, a second plurality of conductors, and a plurality of memory-diodes, each connecting a conductor of the first plurality thereof with a conductor of the second plurality thereof, wherein a first memory-diode of the plurality thereof has a first threshold voltage, and a second memory-diode of the plurality thereof has a second threshold voltage different from the first threshold voltage.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein;

BEST MODE(S) FOR CARRYING OUT THE INVENTION

Reference is now made in detail to specific embodiments of the present invention which illustrate the best mode presently contemplated by the inventors for practicing the invention.

Figure 1:
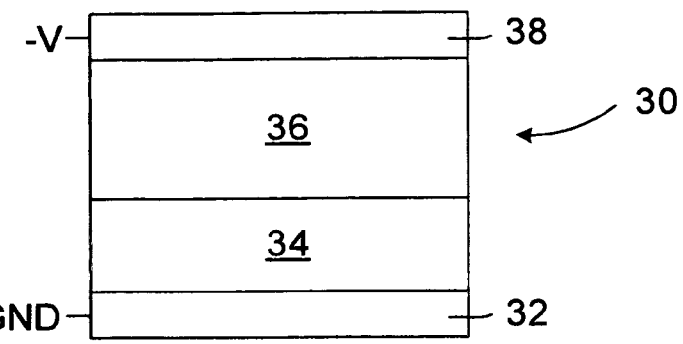
FIG. 1 is a cross-sectional view of a typical memory-diode, illustrating the programming thereof.
Figure 7:
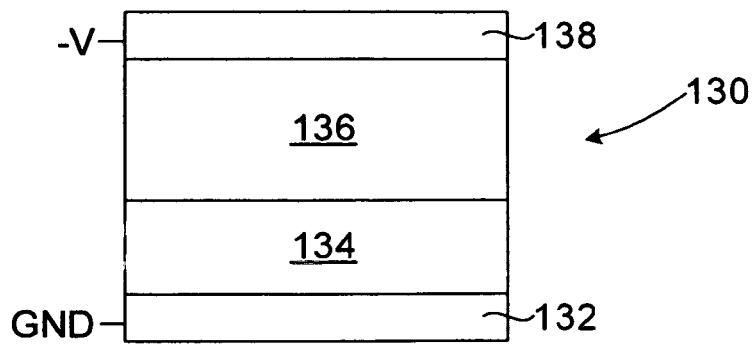
FIG. 7 is a view similar to that shown in FIGS. 1 and 4, illustrating the programming of the memory-diode.

FIG. 7 is similar to FIG. 1, illustrating the programming of a memory-diode 130. The memory-diode 130 includes for example a Cu electrode 132, a superionic $Cu_2S$ layer 134 on the electrode 132, an active $WO_3$ or F8T2 layer 136 on the $Cu_2S$ layer 134, and a Ti electrode 138 on the active layer 136. In programming the memory-diode 130, a negative voltage is applied to the electrode 138, while the electrode 132 is held at ground, so that a programming electrical potential $V_{pg}$ is applied across the memory-diode 130 from a higher to a lower electrical potential in the forward direction of the memory-diode 130 (see also FIG. 8). This potential is sufficient to cause copper ions to be attracted from the superionic layer 134 toward the electrode and 132 into the active layer 136, causing the active layer 136 (and the overall memory-diode 130) to be in a (forward) low-resistance or conductive state. Upon removal of such potential from the memory-diode 130, the copper ions drawn into the active layer 136 during the program step remain therein, so that the active layer 136 (and memory-diode 130) remain in a conductive or low-resistance state.

Figure 8:
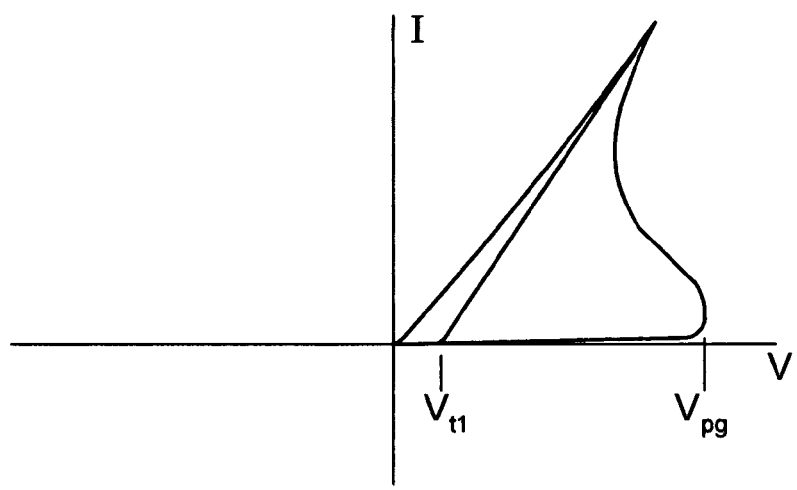
FIG. 8 is a plot of current vs. voltage in the programming of the memory-diode of FIG. 7, illustrating the inherent voltage threshold characteristic resulting from the programming of the memory-diode.
Figure 9:
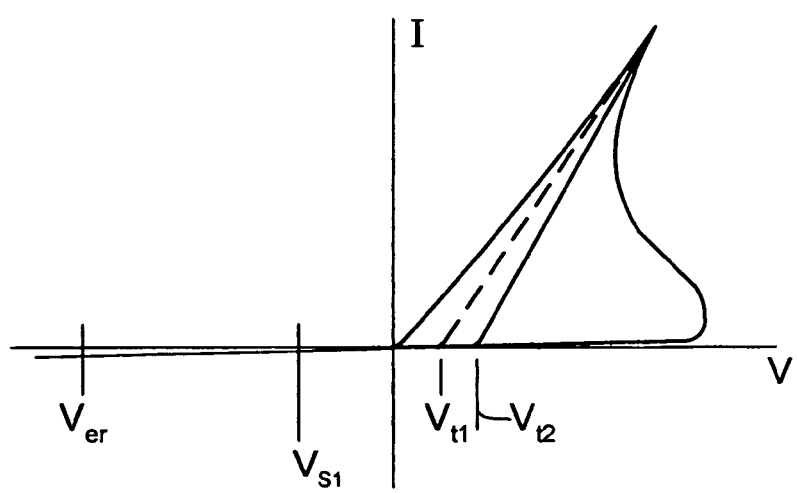
FIG. 9 is a plot of current vs. voltage illustrating the shifting of the threshold voltage of the programmed memory-diode.

As described above, with the memory-diode 130 in this conductive or low-resistance state, the inherent diode characteristic of the memory-diode 130 has threshold voltage $V_{t1}$ (FIG. 8). It had been found that the threshold voltage $V_t$ of the memory-diode 130 may be increased by applying an electric field across the memory-diode 130, from higher to lower electrical potential in the reverse direction of the memory-diode 130. For example, as illustrated in FIG. 9, applying an electric field $V_{s1}$ across the memory-diode 130, from higher to lower electrical potential in the reverse direction of the memory-diode 130, causes the threshold voltage of the memory-diode to increase from $V_{t1}$ to $V_{t2}$, and establishes the threshold voltage of the memory-diode 130 at $V_{t2}$. This electrical potential $V_{s1}$ applied to the memory-diode 130 to establish a new threshold voltage $V_{t2}$ is less than the electrical potential $V_{er}$ applied in the reverse direction of the memory-diode 130 to erase the memory-diode 130, so as to avoid disturbing the state of the programmed memory-diode 130.

Figure 10:
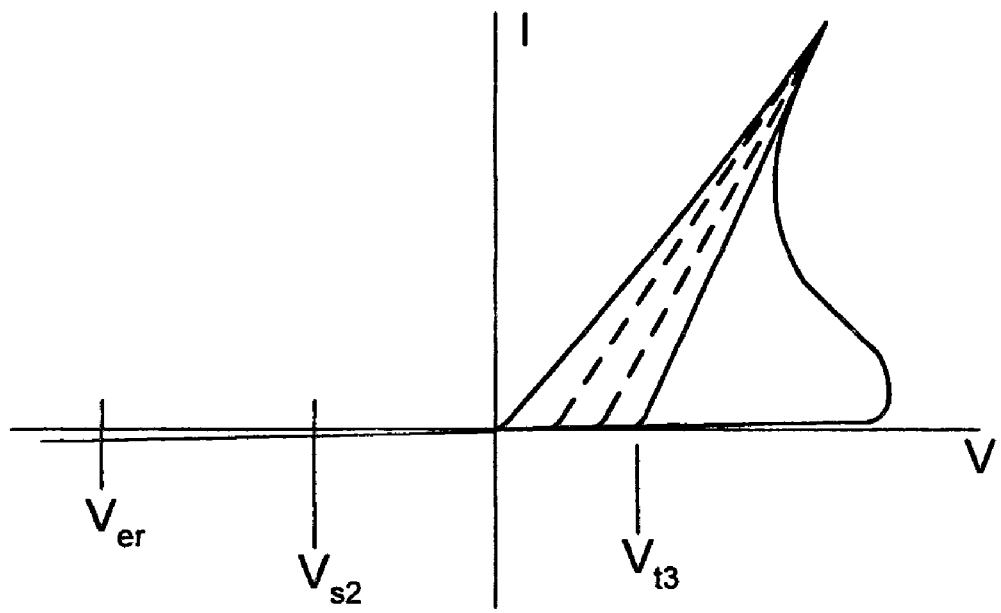
FIG. 10 is a plot of current vs. voltage illustrating the further shifting of the threshold voltage of the programmed memory-diode.

It has been found that the amount of increase in threshold voltage $V_t$ of the memory-diode 130 is dependent on the magnitude of electrical potential $V_s$ so applied across the memory-diode 130 from higher to lower electrical potential in the reverse direction thereof. That is, while such an electrical potential of a magnitude $V_{s1}$ determines a threshold voltage of $V_{t2}$ (FIG. 9), an electrical potential of a magnitude $V_{s2}$, chosen as greater than $V_{s1}$, determines a threshold voltage $V_{t3}$ which is greater than $V_{t2}$ (FIG. 10), an electrical potential of a magnitude $V_{s3}$, chosen as greater than $V_{s2}$, determines a threshold voltage $V_{t4}$ which is greater than $V_{t3}$ (FIG. 11), etc., i.e., a proportionality exists between the magnitude of the electrical potential $V_s$ and the magnitude of the threshold voltage $V_t$. However, in the case where an electrical potential $V_s$ has been applied to determine a magnitude of threshold voltage $V_t$ (for example, electrical potential $V_{s2}$ applied to determine threshold voltage $V_{t3}$), if another electrical potential $V_s$ is applied which is lower in magnitude than the original applied electrical potential $V_s$ (for example $V_{s1}$, of a lower magnitude than $V_{s2}$), the level of threshold voltage ($V_{t3}$) does not change, i.e., the level of threshold voltage $V_t$ is established by the highest magnitude of electrical potential Vs applied (and remains in this example $V_{t3}$). The memory-diode 130 is thus capable of having each of a plurality of different threshold voltages. In all cases, the electrical potential $V_s$ applied to the memory-diode 130 to establish a threshold voltage which is less than the electrical potential $V_{er}$ applied in the reverse direction of the memory-diode 130 to erase the memory-diode 130, so as to avoid disturbing the state of the programmed memory-diode 130.

Figure 12:
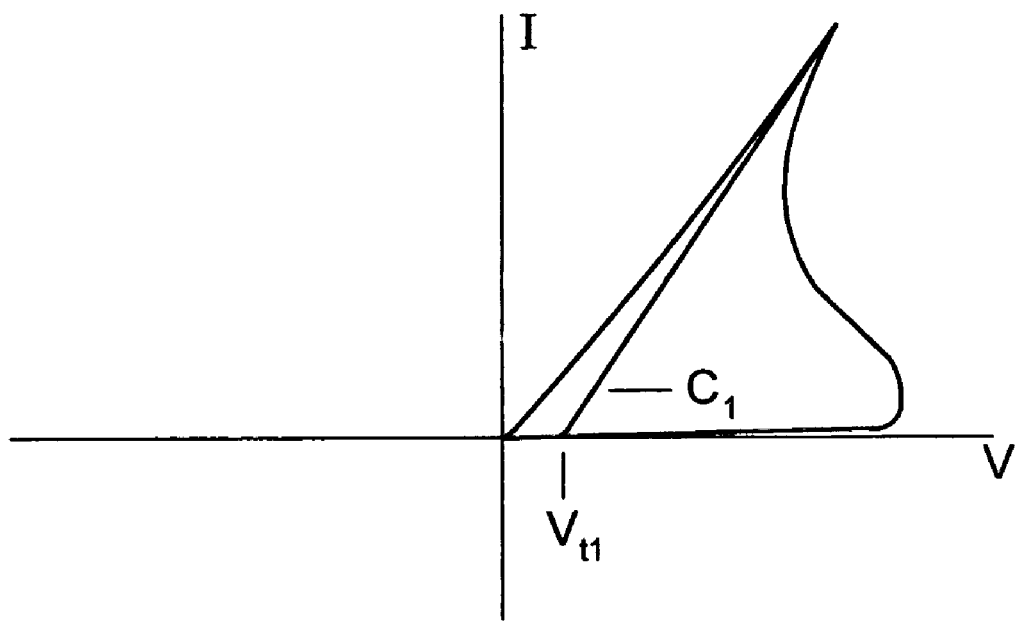
FIG. 12 is a plot of current vs. voltage illustrating the reading of the programmed memory-diode having a shifted threshold voltage in accordance with FIG. 8.

FIG. 12 illustrates the read step of the memory-diode 130 having threshold voltage $V_{t1}$. This read step is undertaken by applying a constant current of a chosen level $C_1$ through the memory-diode 130 in the forward direction of the memory-diode 130. A reading of voltage across the memory-diode 130 is taken, which voltage is indicative of the threshold voltage $V_{t1}$ of the memory-diode 130.

Figure 13:
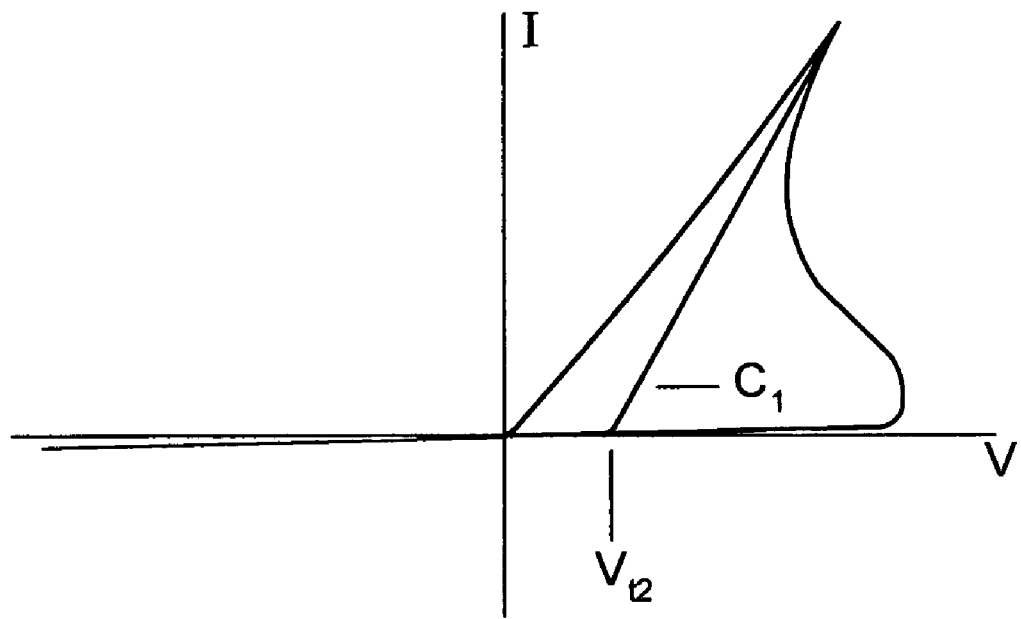
FIG. 13 is a plot of current vs. voltage illustrating the reading of the programmed memory-diode having a shifted threshold voltage in accordance with FIG. 9.

FIG. 13 illustrates the read step of the memory-diode 130 having threshold voltage $V_{t2}$. Again, this read step is undertaken by applying the constant current of a chosen level $C_1$ (the same magnitude as in the example of FIG. 12) through the memory-diode 130 in the forward direction of the memory-diode 130. A reading of voltage across the memory-diode 130 is taken, which voltage is indicative of the threshold voltage $V_{t2}$ of the memory-diode 130.

Figure 14:
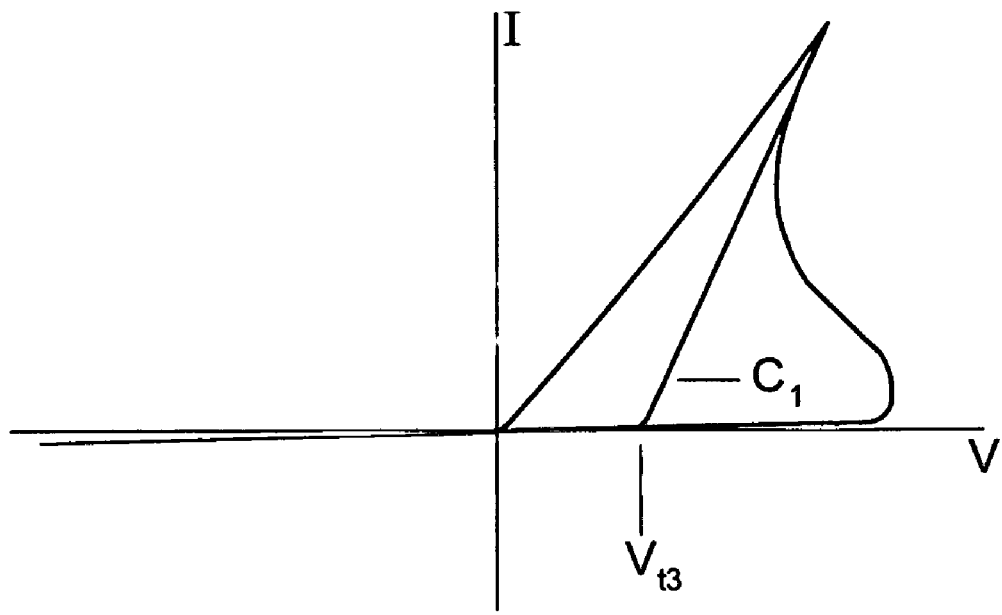
FIG. 14 is a plot of current vs. voltage illustrating the reading of the programmed memory-diode having a shifted threshold voltage in accordance with FIG. 10.

FIG. 14 illustrates the read step of the memory-diode 130 having threshold voltage $V_{t3}$. Again, this read step is undertaken by applying the constant current of a chosen level $C_1$ (the same magnitude as in the examples of FIGS. 12 and 13) through the memory-diode 130 in the forward direction of the memory-diode 130. A reading of voltage across the memory-diode is taken, which voltage is indicative of the threshold voltage $V_{t3}$ of the memory-diode.

Figure 15:
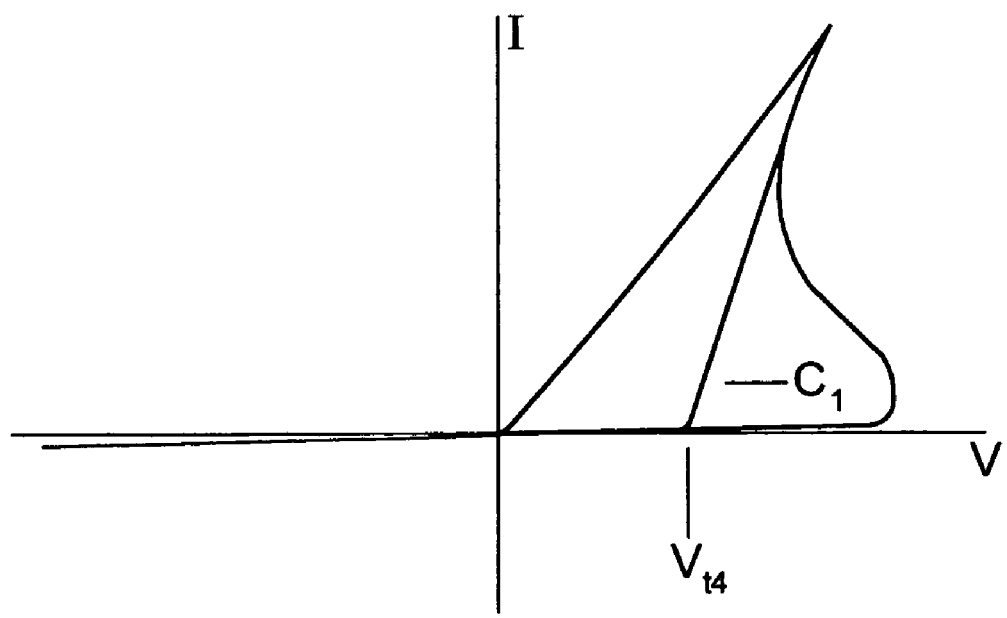
FIG. 15 is a plot of current vs. voltage illustrating the reading of the programmed memory-diode having a shifted threshold voltage in accordance with FIG. 11.

FIG. 15 illustrates the read step of the memory-diode 130 having threshold voltage $V_{t4}$. Again, this read step is undertaken by applying the constant current of a chosen level $C_1$ (the same magnitude as in the examples of FIGS. 12, 13 and 14) through the memory-diode 130 in the forward direction of the memory-diode 130. A reading of voltage across the memory-diode 130 is taken, which voltage is indicative of the threshold voltage $V_{t4}$ of the memory-diode 130.

It will be seen that the level of voltage across the memory-diode 130 during the read step is dependent upon the so-determined threshold voltage of the memory-diode 130.

In the present example, the memory-diode 130 is capable of adopting each of four different states. The particular state of the memory-diode 130 can be determined by applying a set read current (in this case current $C_1$) across the memory-diode 130, and reading the level of voltage across the memory-diode 130. In this example, four different levels of voltage are determined, each tied to a particular state of the memory-diode 130.

FIGS. 16-19 illustrate another approach for reading the states of the memory-diode.

Figure 16:
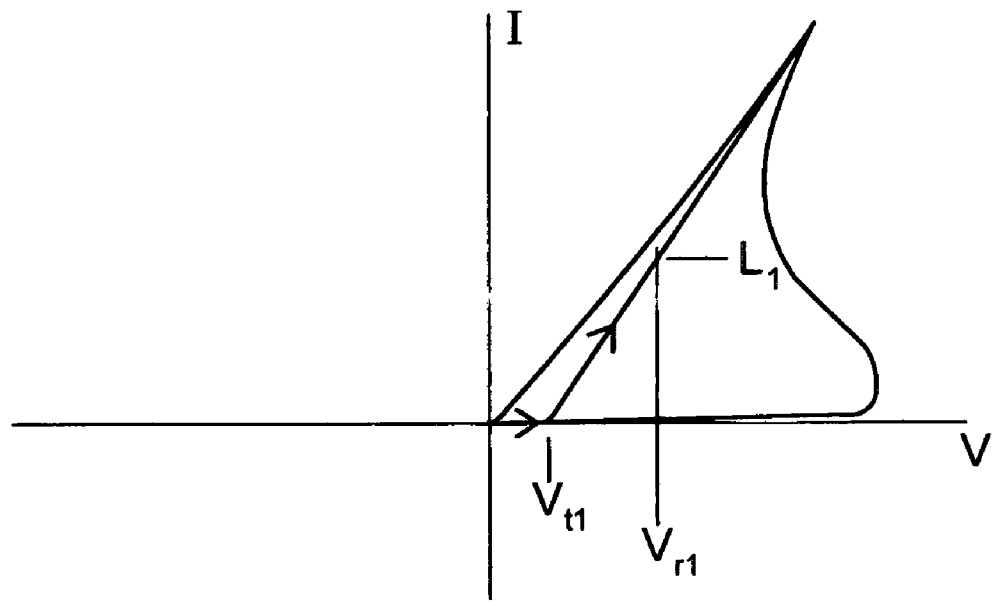
FIG. 16 is a plot of current vs. voltage illustrating another approach in the reading of the programmed memory-diode having a shifted threshold voltage in accordance with FIG. 8.

FIG. 16 illustrates the read step of the memory-diode 130 having threshold voltage $V_{t1}$. This read step is undertaken by applying an electrical potential of a chosen level $V_{r1}$ across the memory-diode 130 from higher to lower potential in the forward direction of the memory-diode 130. This electrical potential $V_{r1}$ is greater than the threshold voltage $V_{t1}$ of the memory-diode 130 and causes current to be conducted through the memory-diode 130 at a level $L_1$.

Figure 17:
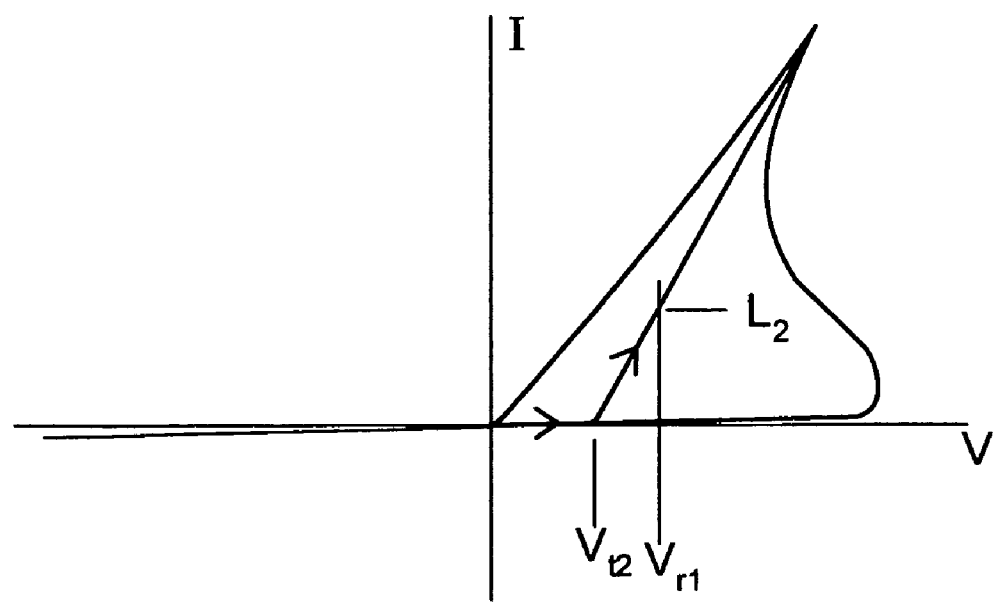
FIG. 17 is a plot of current vs. voltage illustrating the approach of FIG. 16 in reading the programmed memory-diode having a shifted threshold voltage in accordance with FIG. 9.

FIG. 17 illustrates the read step of the memory-diode 130 having threshold voltage $V_{t2}$. Again, this read step is undertaken by applying the electrical potential $V_{r1}$ (the same magnitude as in the example of FIG. 16) across the memory-diode 130 from higher to lower potential in the forward direction of the memory-diode 130. This electrical potential $V_{r1}$ is greater than the threshold voltage $V_{t2}$ of the memory-diode 130 and causes current to be conducted through the memory-diode 130 at a level $L_2$, different from (lower than) the level $L_1$.

Figure 18:
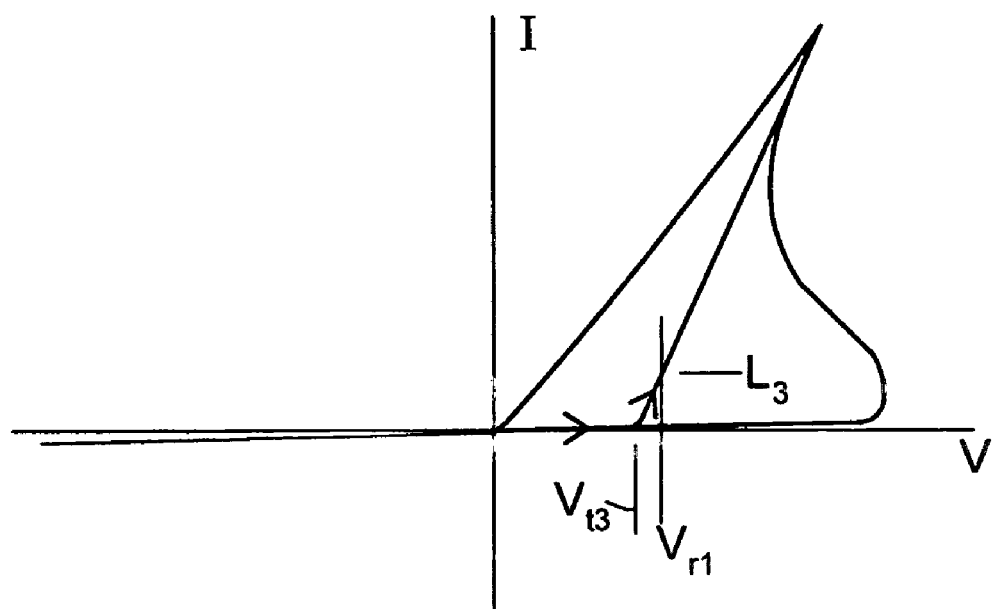
FIG. 18 is a plot of current vs. voltage illustrating the approach of FIGS. 16 and 17 in reading the programmed memory-diode having a shifted threshold voltage in accordance with FIG. 10.

FIG. 18 illustrates the read step of the memory-diode 130 having threshold voltage $V_{t3}$. Again, this read step is undertaken by applying the electrical potential $V_{r1}$ (the same magnitude as in the examples of FIGS. 16 and 17) across the memory-diode 130 from higher to lower potential in the forward direction of the memory-diode 130. This electrical potential $V_{r1}$ is greater than the threshold voltage $V_{t3}$ of the memory-diode 130 and causes current to be conducted through the memory-diode 130 at a level $L_3$, different from (lower than) the level $L_2$.

Figure 19:
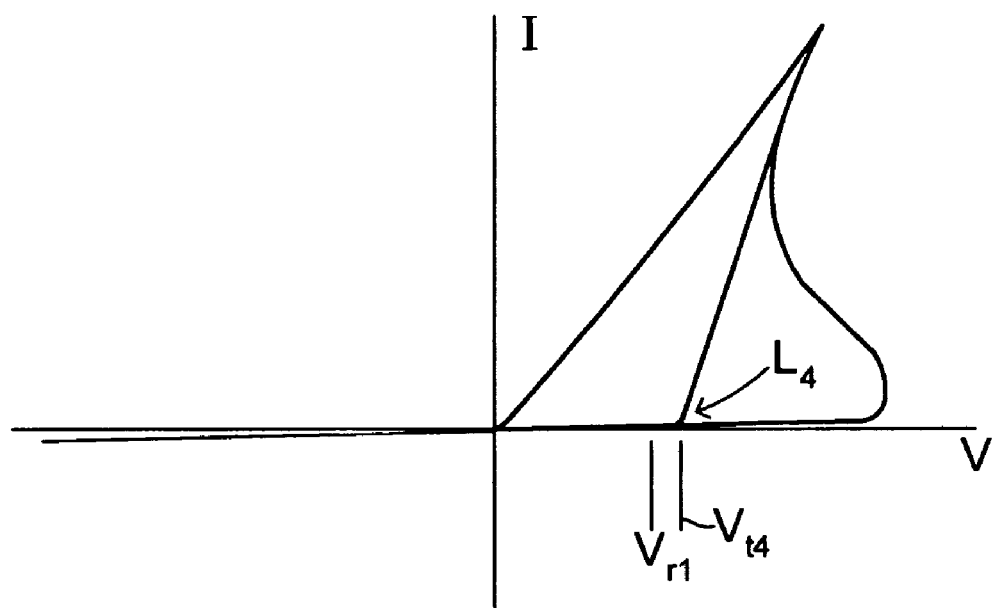
FIG. 19 is a plot of current vs. voltage illustrating the approach of FIGS. 16, 17 and 18 in reading the programmed memory-diode having a shifted threshold voltage in accordance with FIG. 11.

FIG. 19 illustrates the read step of the memory-diode 130 having threshold voltage $V_{t4}$. Again, this read step is undertaken by applying the electrical potential $V_{r1}$ (the same magnitude as in the examples of FIGS. 16, 17 and 18) across the memory-diode 130 from higher to lower potential in the forward direction of the memory-diode 130. This electrical potential $V_{r1}$ is less than the threshold voltage $V_{t4}$ of the memory-diode 130, so that in this situation the memory-diode 130 conducts substantially no current, i.e., the current level therethrough (indicated as $L_4$) is substantially zero (equivalent to an erase state of the memory-diode 130).

It will be seen that the level of current through the memory-diode 130 during the read step is dependent upon the so-determined threshold voltage of the memory-diode 130.

FIGS. 20-24 illustrate yet another approach for reading the states of the memory-diode.

Figure 11:
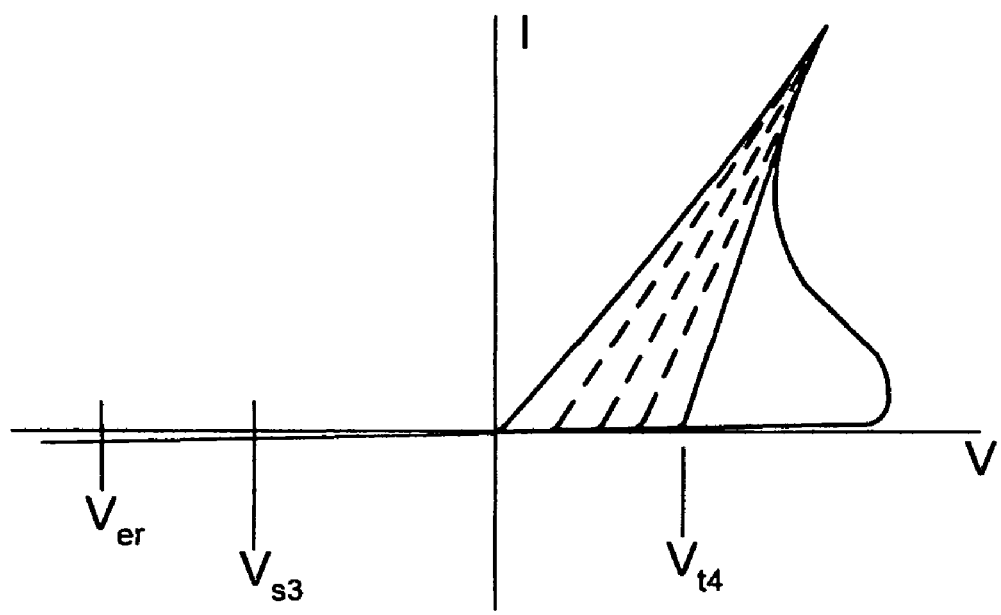
FIG. 11 is a plot of current vs. voltage illustrating the still further shifting of the threshold voltage of the programmed memory-diode.
Figure 20:
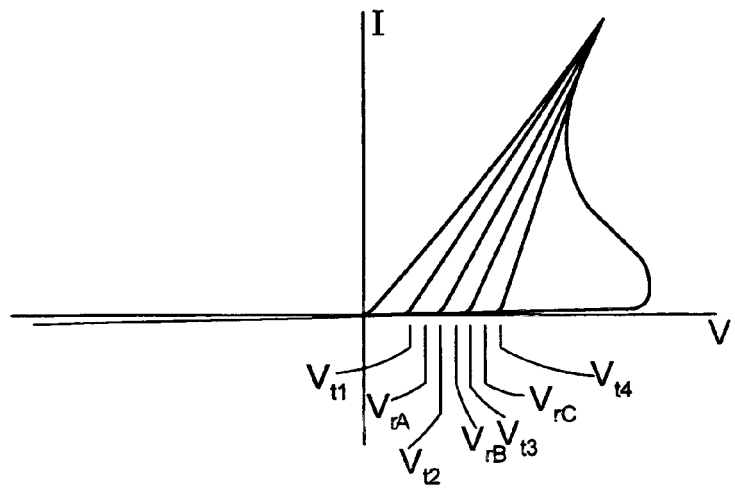
FIG. 20 is a plot of current vs. voltage illustrating the various threshold voltages which may be achieved in a memory-diode, as shown in FIG. 11.

FIG. 20 is similar to FIG. 11 and illustrates the example wherein the four threshold voltages $V_{t1}$, $V_{t2}$, $V_{t3}$, $V_{t4}$ may be achieved in any particular memory-diode 130. FIG. 20 also illustrates read voltages $V_{rA}$ (greater than $V_{t1}$ and less than $V_{t2}$), $V_{rB}$ (greater than $V_{t2}$ and less than $V_{t3}$), $V_{rC}$ (greater than $V_{t3}$ and less than $V_{t4}$), which are applied to any particular programmed memory-diode 130 in successively increasing values as will now be described.

Figure 21:
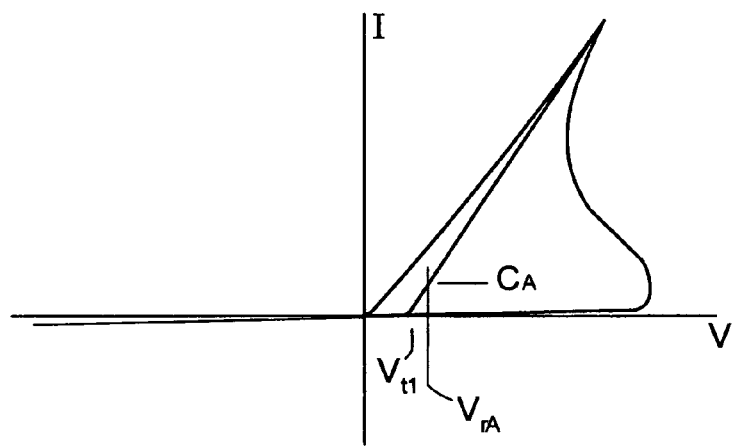
FIG. 21 is a plot of current vs. voltage illustrating yet another approach in the reading of the programmed memory-diode having a shifted threshold voltage in accordance with FIG. 8.

FIG. 21 illustrates the read step of the memory-diode 130 having threshold voltage $V_{t1}$. This read step is undertaken by applying an electrical potential of the chosen level $V_{rA}$ across the memory-diode 130 from higher to lower potential in the forward direction of the memory-diode 130. This electrical potential $V_{rA}$ is greater than the threshold voltage $V_{t1}$ of the memory-diode 130 as described above and causes current to be conducted through the memory-diode 130 (current $C_A$).

Figure 22:
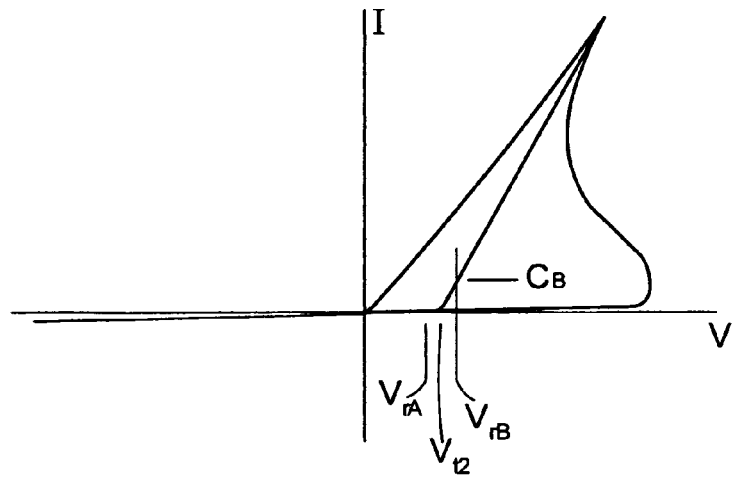
FIG. 22 is a plot of current vs. voltage illustrating the approach of FIG. 21 in reading the programmed memory-diode having a shifted threshold voltage in accordance with FIG. 9.

FIG. 22 illustrates the read step of the memory-diode 130 having threshold voltage $V_{t2}$. This read step is initially undertaken by applying the electrical potential $V_{rA}$ across the memory-diode 130 from higher to lower potential in the forward direction of the memory-diode 130. This electrical potential $V_{rA}$ is less than the threshold voltage $V_{t2}$ of the memory-diode 130, and current will not be conducted through the memory-diode 130. Then, the electrical potential $V_{rB}$ is applied across the memory-diode 130 from higher to lower potential in the forward direction of the memory-diode 130. This electrical potential $V_{rB}$ is greater than the threshold voltage $V_{t2}$ of the memory-diode 130 and causes current to be conducted through the memory-diode 130 (current $C_B$).

Figure 23:
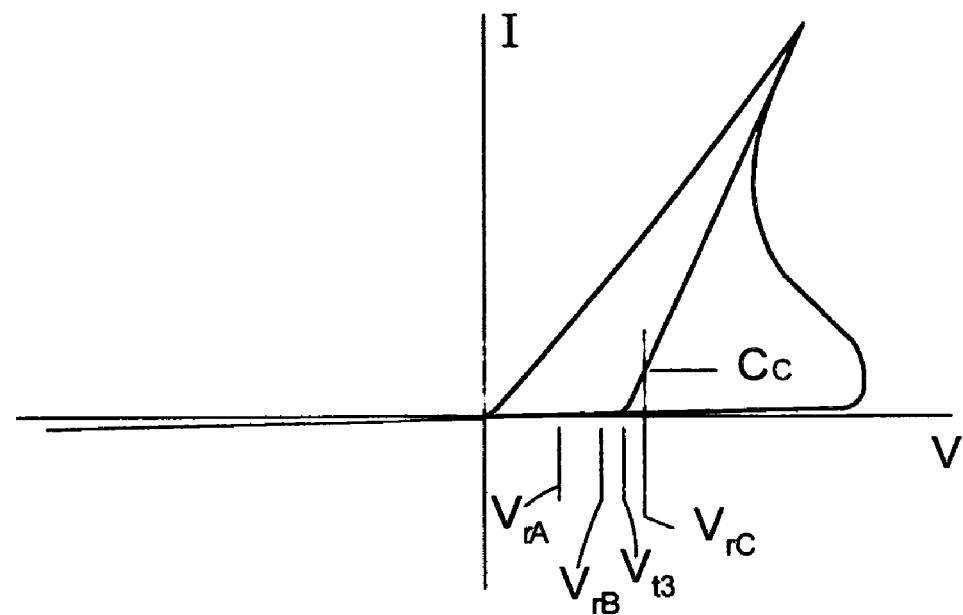
FIG. 23 is a plot of current vs. voltage illustrating the approach of FIGS. 21 and 22 in reading the programmed memory-diode having a shifted threshold voltage in accordance with FIG. 10.

FIG. 23 illustrates the read step of the memory-diode 130 having threshold voltage $V_{t3}$. This read step is initially undertaken by applying the electrical potential $V_{rA}$ across the memory-diode 130 from higher to lower potential in the forward direction of the memory-diode 130. This electrical potential $V_{rA}$ is less than the threshold voltage $V_{t3}$ of the memory-diode 130, and current will not be conducted through the memory-diode 130. Then, the electrical potential $V_{rB}$ is applied across the memory-diode 130 from higher to lower potential in the forward direction of the memory-diode 130. This electrical potential $V_{rB}$ is also less than the threshold voltage $V_{t3}$ of the memory-diode 130, and current will not be conducted through the memory-diode 130. Then, the electrical potential $V_{rC}$ is applied across the memory-diode 130 from higher to lower potential in the forward direction of the memory-diode 130. This electrical potential $V_{rC}$ is greater than the threshold voltage $V_{t3}$ of the memory-diode 130 and causes current to be conducted through the memory-diode 130 (current $C_C$).

Figure 24:
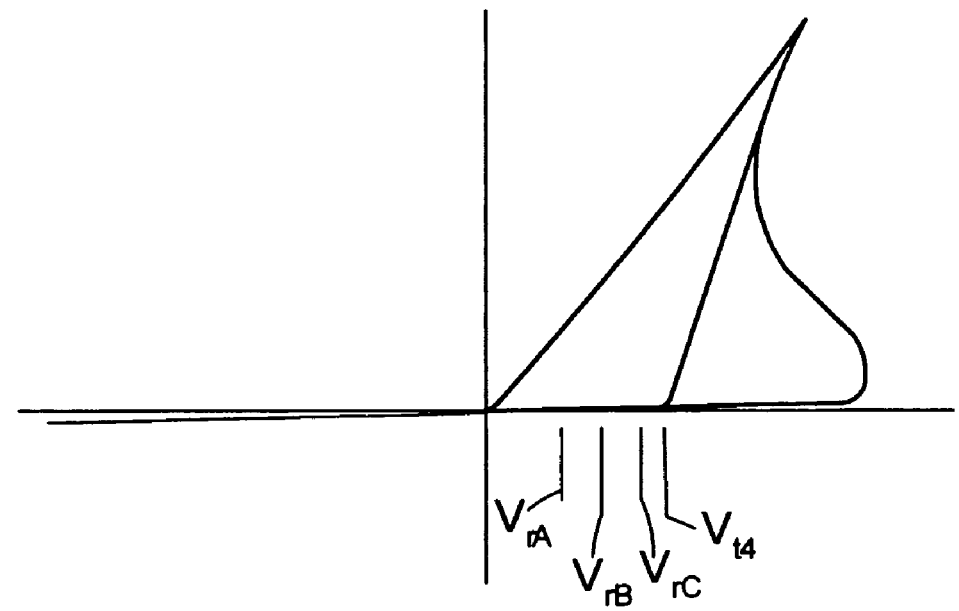
FIG. 24 is a plot of current vs. voltage illustrating the approach of FIGS. 21, 22 and 23 in reading the programmed memory-diode having a shifted threshold voltage in accordance with FIG. 11.

In the event successive application of electrical potentials $V_{rA}, V_{rB}, V_{rC}$ do not cause current to flow, is understood than a threshold voltage greater than $V_{rC}$, i.e., $V_{t4}$, has been established for the memory diode 130 (FIG. 24).

As will be seen, the voltages $V_{rA}$, $V_{rB}$, $V_{rC}$ are applied successively, in successively increasing values, to a memory-diode 130, and the programmed state of the memory-diode 130 will be readily recognized by undertaking this procedure.

Figure 25:
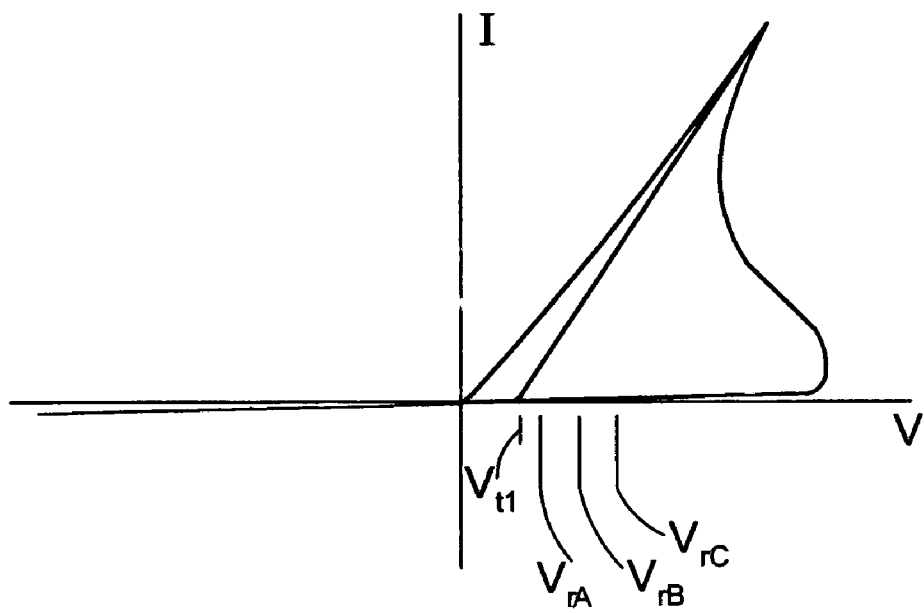
FIG. 25 is a plot of current vs. voltage illustrating a memory-diode having a first threshold voltage.
Figure 26:
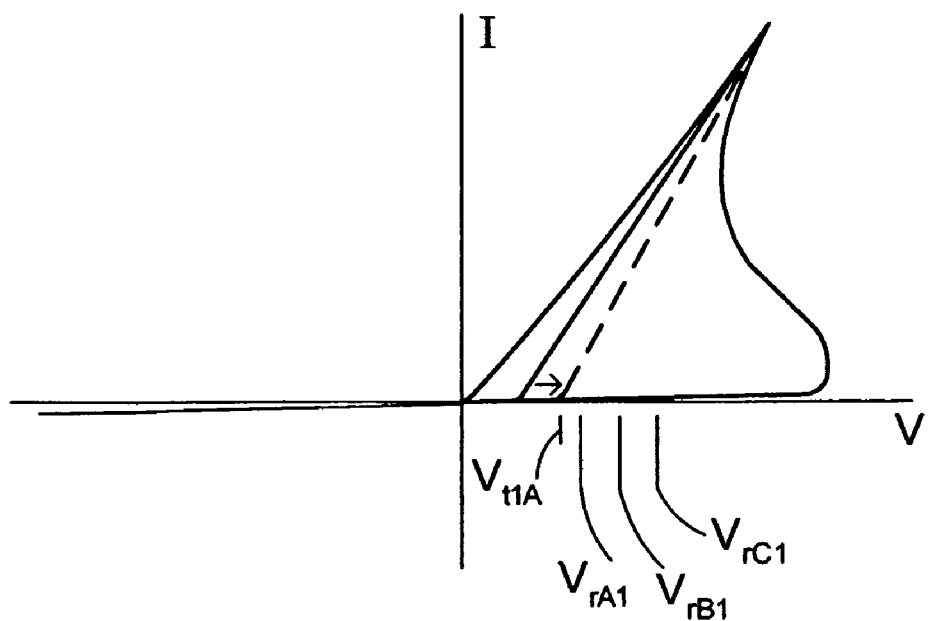
FIG. 26 is a plot of current vs. voltage of the memory-diode of FIG. 25, and further illustrating a shift in threshold voltage thereof.
Figure 27:
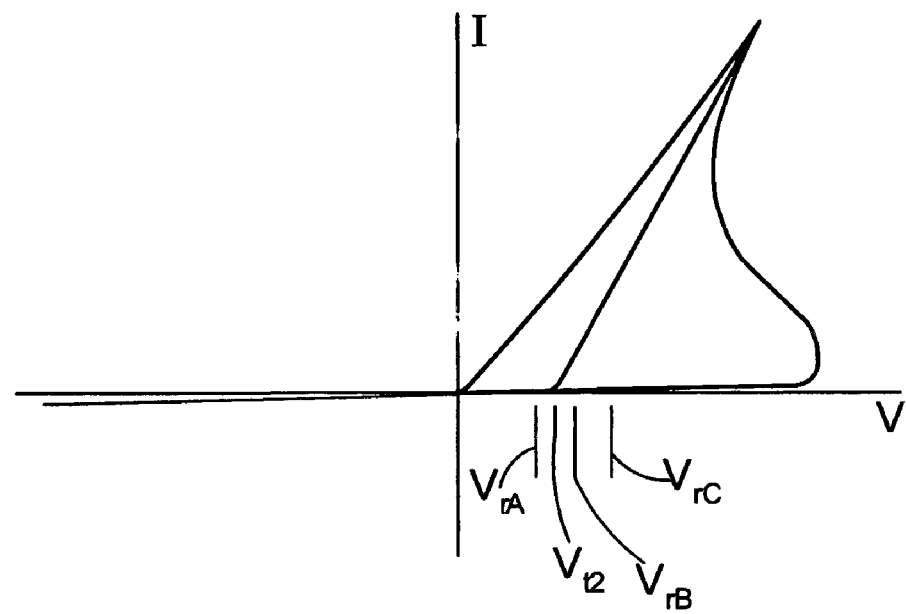
FIG. 27 is a plot of current vs. voltage illustrating a memory-diode having a second threshold voltage.
Figure 28:
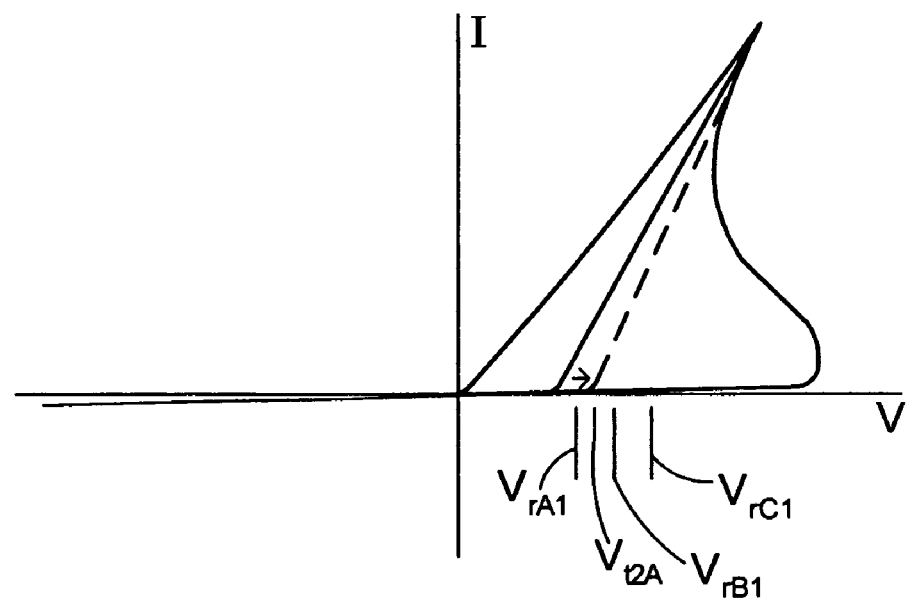
FIG. 28 is a plot of current vs. voltage of the memory-diode of FIG. 27, and further illustrating a shift in threshold voltage thereof.
Figure 29:
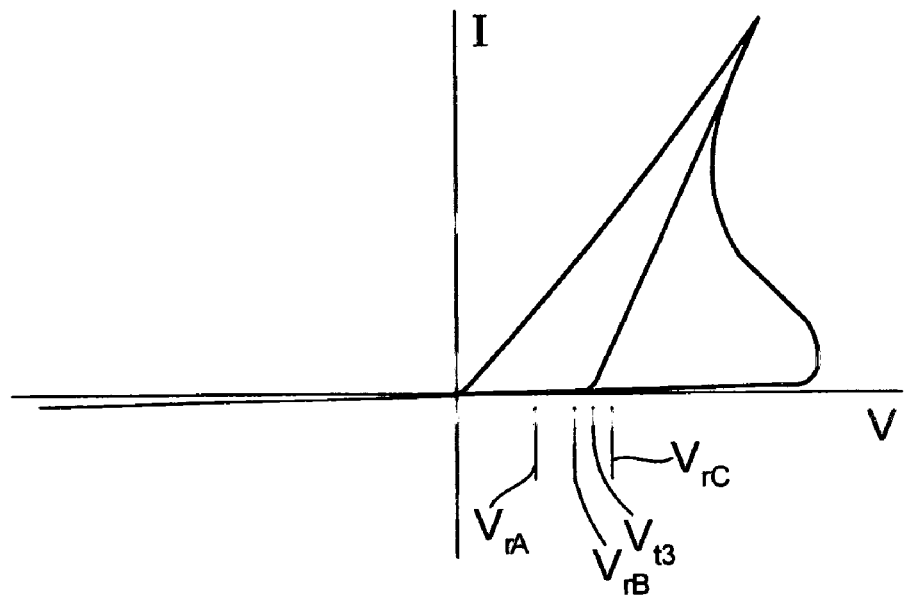
FIG. 29 is a plot of current vs. voltage illustrating a memory-diode having a third threshold voltage.

FIG. 25 illustrates the memory-diode 130, in this example having a threshold voltage $V_{t1}$, similar to FIG. 21, and further illustrates the successively applied read voltages $V_{rA}$, $V_{rB}$, $V_{rC}$. FIG. 27 illustrates the memory-diode 130 having in this example a threshold voltage $V_{t2}$, similar to FIG. 22, and again illustrates the successively applied read voltages $V_{rA}$, $V_{rB}$, $V_{rC}$. FIG. 29 illustrates the memory-diode 130 having in this example a threshold voltage $V_{t3}$, similar to FIG. 23, and again illustrates the successively applied read voltages $V_{rA}$, $V_{rB}$, $V_{rC}$. It has been observed that over time, due to ion relaxation, the threshold voltage of a memory-diode 130 will drift toward a higher value. For example, the memory-diode 130 as illustrated in FIG. 25 originally has a threshold voltage $V_{t1}$, which will over time drift to a higher threshold voltage (in this example illustrated as $V_{t1A}$, FIG. 26. Similarly, and simultaneously, the memory-diode 130 as illustrated in FIG. 27 originally has a threshold voltage $V_{t2}$, which will over time drift to a higher threshold voltage (in this example illustrated as $V_{t2A}$), FIG. 28. Similarly, and simultaneously, the memory-diode 130 as illustrated in FIG. 29 originally has a threshold voltage $V_{t3}$, which will over time drift to a higher threshold voltage (in this example illustrated as $V_{t3A}$), FIG. 30. The shifts in the threshold voltages are tracked by for example comparing them in an ongoing manner with respective reference threshold voltages $V_{t1}, V_{t2}, V_{t3}$, and the respective read voltages $V_{rA}, V_{rB}, V_{rC}$ are shifted (increased) in the same direction and in the same magnitude (FIGS. 26, 28 and 30 respectively) to values $V_{rA1}, V_{rB1}, V_{rC1}$ respectively to compensate for this drift. Thus, it is assured that the read step will provide proper information relating to the state of the memory-diode.

Figure 2:
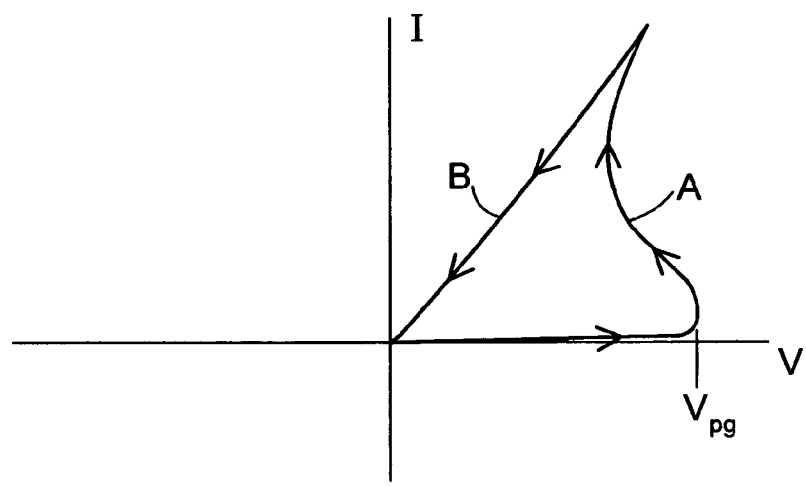
FIG. 2 is a plot of current vs. voltage in the programming of the memory-diode of FIG. 1.
Figure 3:
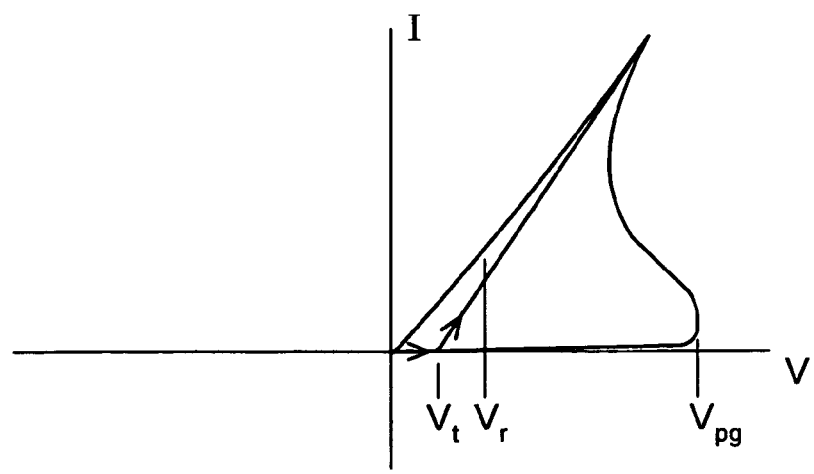
FIG. 3 is a plot of current vs. voltage in the reading of the program memory-diode of FIG. 1.
Figure 4:
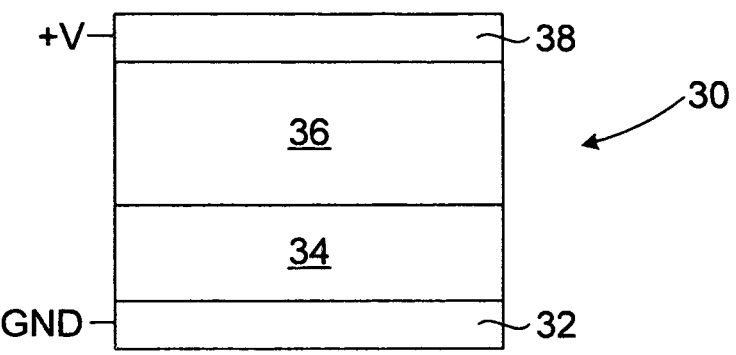
FIG. 4 is a view similar to that shown in FIG. 1, illustrating the erasing of the memory-diode.
Figure 5:
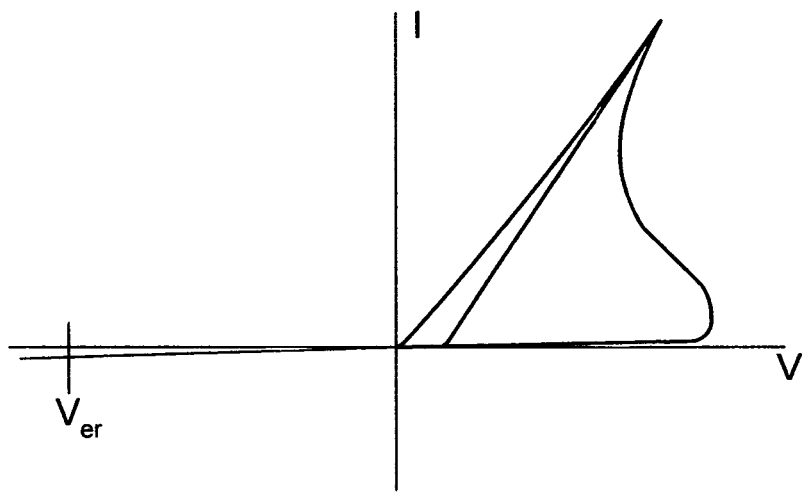
FIG. 5 is a plot of current vs. voltage in the erasing of a programmed memory-diode in accordance with FIG. 4.
Figure 6:
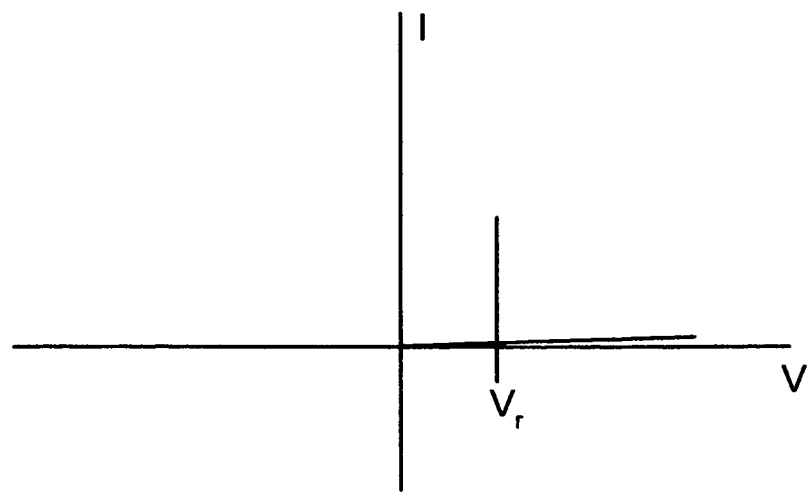
FIG. 6 is a plot of current vs. voltage in the reading of the erased memory-diode in accordance with FIG. 5.

The materials of the active and passive layers 136, 134 of the memory-diode 130 may be such that the voltage vs. current characteristics of each threshold state resemble the curve A in FIG. 2, with each of the threshold voltages $V_{t1}, V_{t2}, V_{t3}, V_{t4}$ being less than the programming voltage $V_{pg}$. In such case, upon a read voltage greater than the threshold voltage being applied, the current through the memory-diode 130 will be determined by the line B of FIG. 2. In any case, the overall operation of this approach is substantially the same as that as illustrated in FIGS. 20-24.

It has been found that each of the read steps as described may disturb the established threshold voltage of the memory-diode 130, by lowering such threshold voltage from its previously selected and established level. In order to reestablish the selected threshold voltage, a read-completion step is undertaken, wherein the threshold voltage of the memory-diode 130 is increased to its previously established level by applying an electric field of appropriate value across the memory-diode 130, from higher to lower electrical potential in the reverse direction of the memory-diode 130, which causes the threshold voltage of the memory-diode 130 to increase to its previously selected level.

In the present examples, the memory-diode 130 is capable of adopting each of four different states. The particular state of the memory-diode 130 can be determined by applying a set electrical potential across the memory-diode 130, and reading the level of current through the memory-diode 130. In this example, four different levels of current are determined.

Rather than adopting one of two states as in the previously described memory-diode 30, the present memory-diode 130 is capable of adopting more than two states, i.e., in the present example, four states.

It will be understood that the difference in threshold voltage V, from one state to the next can be set more closely than in the present example, so that the memory-diode 130 would be capable of adopting more than four states.

Figure 30:
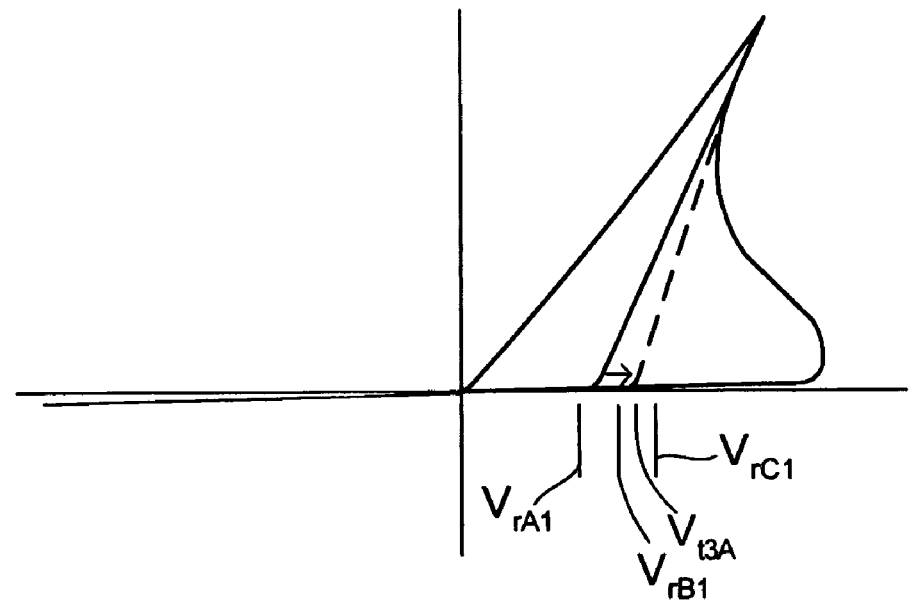
FIG. 30 is a plot of current vs. voltage of the memory-diode of FIG. 29, and further illustrating a shift in threshold voltage thereof.
Figure 31:
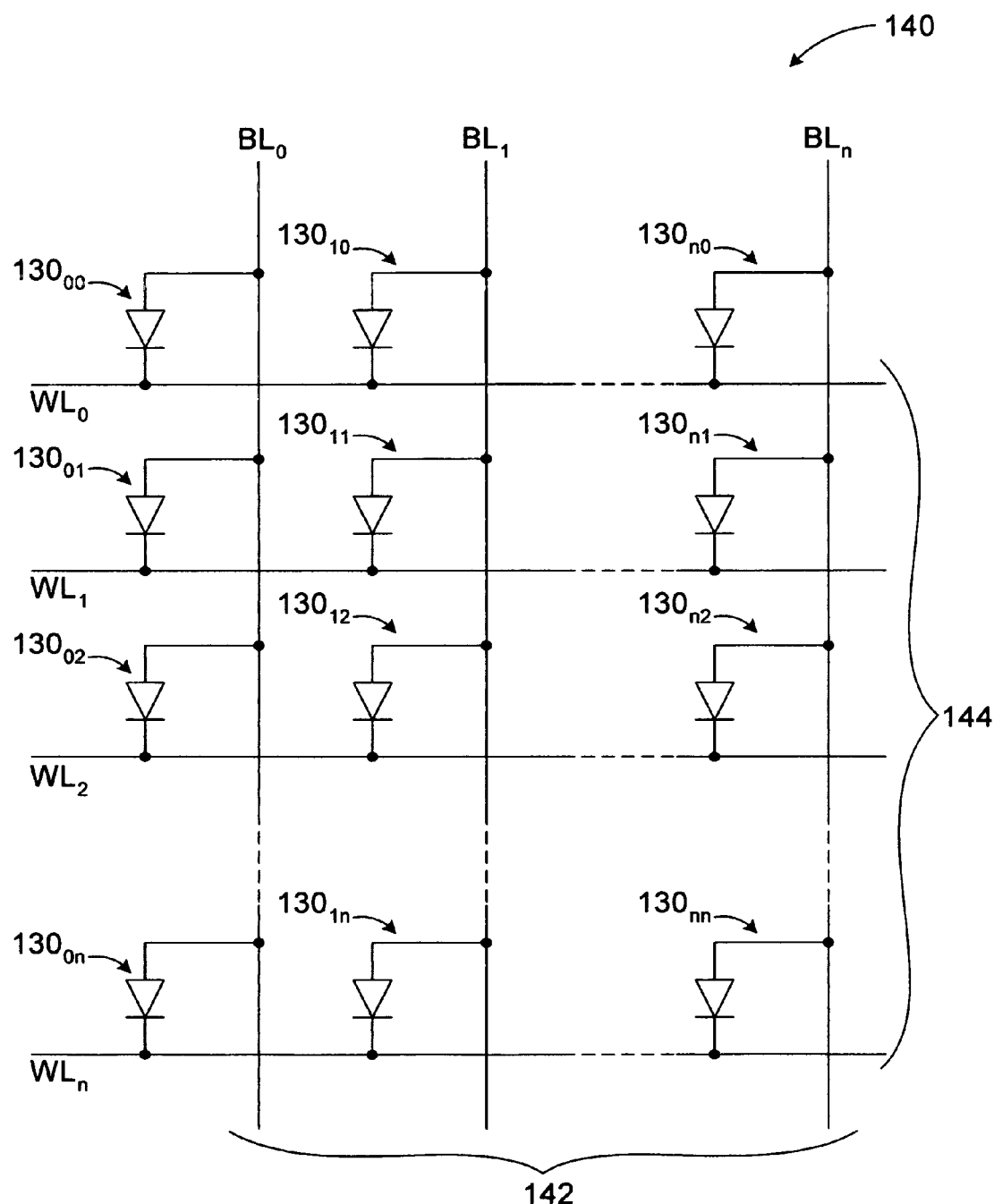
FIG. 31 is a schematic illustration of a memory array which includes memory-diodes in accordance with the present invention.

FIG. 30 illustrates a memory-diode array 140 which incorporates memory-diodes 130 of the type described. As illustrated in FIG. 30, the memory-diode array 140 includes a fist plurality 142 of parallel conductors (bit lines) $BL_0, BL_1, \ldots BL_n$, and a second plurality 144 of parallel conductors (word lines) $WL_0, WL_1, WL_2, \ldots WL_n$ overlying and spaced from, orthogonal to, and crossing the first plurality of conductors 142. A plurality of memory-diodes 130 of the type described above are included. Each memory-diode 130 connects a conductor BL of the first plurality 142 thereof with a conductor WL of the second plurality 144 thereof at the intersection of those conductors, with the memory-diode 130 thereof in a forward direction from the conductor BL of the first plurality 142 thereof to the conductor WL of the second plurality 144 thereof. For example, as shown in FIG. 25, memory-diode $130_{00}$ connects conductor $BL_0$ of the first plurality of conductors 142 with conductor $WL_0$ of the second plurality of conductors 144 at the intersection of those conductors $BL_0, WL_0$, memory-diode $130_{10}$ connects conductor $BL_1$ of the first plurality of conductors 142 with conductor $WL_0$ of the second plurality of conductors 144 at the intersection of those conductors $BL_1, WL_0$, etc.

The threshold voltages of the memory-diodes of the array 140 can be selected in accordance with the above approach. For example, the threshold voltage of the memory-diode $130_{00}$ can be selected as $V_{t1}$, the threshold voltage of the memory-diode $130_{01}$ can be selected as $V_{t2}$, the threshold voltage of the memory-diode $130_{02}$ can be selected as $V_{t3}$, and the threshold voltage of the memory-diode $130_{0n}$ can be selected as $V_{t4}$ (each such threshold voltage being different from the others). Each of the threshold voltages would be established as described above, i.e., by application of an electrical potential thereto from higher to lower potential in the reverse direction of the memory diode, of a magnitude to determine that threshold voltage.

In reading the state of a memory-diode, for example memory-diode $130_{00}$, in the first approach, read current $C_1$ is applied across the memory-diode $130_{00}$ in the forward direction of the memory-diode $130_{00}$, determining a level of voltage through the memory-diode $130_{00}$ which is indicative of threshold voltage thereof, as described above. The state of each of the other memory-diodes $130_{00}$, $130_{01}$, $130_{0n}$ is read the same manner, by applying the same read current $C_1$ as in reading the state of the memory-diode $130_{00}$. With the current $C_1$ applied to each memory-diode being the same, different levels of voltage are read across the individual memory-diodes $130_{00}$, $130_{01}$, $130_{02}$, $130_{0n}$, as described above.

In reading the state of a memory-diode in the second approach, for example memory-diode $130_{00}$, a read electrical potential $V_{r1}$ is applied across the memory-diode $130_{00}$ from higher to lower potential in the forward direction of the memory-diode $130_{00}$, determining a level of current $L_1$ therethrough, as described above. The state of each of the other memory-diodes $130_{00}$, $130_{01}$, $130_{0n}$ is read the same manner, by applying the same read electrical potential as in reading the state of the memory-diode $130_{00}$. With the read potential $V_{r1}$ applied to each memory-diode being the same, different levels of current are read across the individual memory-diodes $130_{00}$, $130_{01}$, $130_{02}$, $130_{0n}$, as described above.

In reading the state of a memory-diode in the third approach, the read voltage $V_{rA}$ is applied across the memory-diode from higher to lower potential in the forward direction of the memory-diode. If current flows through the memory-diode, is understood that the memory-diode had been programmed with a threshold voltage $V_{t1}$. If current does not flow through the memory-diode, read voltage $V_{rB}$ is applied across the memory-diode from higher to lower potential in the forward direction of the memory-diode. If current flows through the memory-diode, is understood that the memory-diode had been programmed with a threshold voltage $V_{t2}$. If current does not flow through the memory-diode, read voltage $V_{rC}$ is applied across the memory-diode from higher to lower potential in the forward direction of the memory-diode. If current flows through the memory-diode, is understood that the memory-diode had been programmed with a threshold voltage $V_{t3}$. If current does not flow through the memory-diode, it is understood that the memory-diode had been programmed with a threshold voltage $V_{t4}$.

Thus, the present memory-diode 130 is capable of adopting each of a plurality of states, each of which can be read, greatly adding to the utility thereof.

In the programming of a particular selected memory-diode 130 of the array 140, the selected memory-diode has applied thereacross in the forward direction a programming voltage Vpg. During such programming of the selected memory-diode 130, other memory-diodes 130 of the array 140 also have a voltage applied thereacross in the forward direction thereof. In order to avoid overcoming the threshold voltages of the non-selected memory-diodes, which could cause significant current leakage in the array 140, threshold voltages of the memory-diodes can be set high enough (in accordance with the above-described procedure) so that such non-selected memory-diodes do not conduct under such conditions.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of undertaking a procedure on a memory-diode comprising:
   providing a conductive memory-diode which is capable of having each of a plurality of different states dependent on different respective threshold voltages; and
   providing that a read process of the conductive memory-diode is indicative of the state of the memory-diode.

2. The method of claim 1 wherein the read process provides a level of voltage across the memory-diode which is dependent upon the threshold voltage of the memory-diode.

3. The method of claim 2 wherein the read process of the memory-diode is undertaken by applying a current through the memory-diode in the forward direction of the memory-diode.

4. The method of claim 3 wherein for the read process, the magnitude of current applied through the memory-diode in the forward direction of the memory-diode, for any of the plurality of different threshold voltages, is substantially the same.

5. The method of claim 4 wherein a threshold voltage of the plurality of different threshold voltages of the memory-diode is determined by applying an electrical potential across the memory-diode from higher to lower potential in the reverse direction of the memory-diode.

6. The method of claim 1 wherein a threshold voltage of the plurality of different threshold voltages of the memory-diode is determined by applying an electrical potential across the memory-diode from higher to lower potential in the reverse direction of the memory-diode.

7. The method of claim 1 wherein the read process provides a level of current through the memory-diode which is dependent upon the determined threshold voltage of the memory-diode.

8. The method of claim 7 wherein the read process of the memory-diode is undertaken by applying an electrical potential across the memory-diode from higher to lower potential in the forward direction of the memory-diode.

9. The method of claim 8 wherein for the read process, the magnitude of electrical potential applied across the memory-diode from higher to lower potential in the forward direction of the memory-diode, for any of the plurality of different threshold voltages, is substantially the same.

10. The method of claim 9 wherein a threshold voltage of the plurality of different threshold voltages of the memory-diode is determined by applying an electrical potential across the memory-diode from higher to lower potential in the reverse direction of the memory-diode.

11. The method of claim 7 wherein a threshold voltage of the plurality of different threshold voltages of the memory-diode is determined by applying an electrical potential across the memory-diode from higher to lower potential in the reverse direction of the memory-diode.

12. The method of claim 7 wherein, for a threshold voltage of the plurality thereof, the read process of the state of the memory-diode provides a current level therethrough which is substantially zero.

13. The method of claim 7 wherein, for a threshold voltage of the plurality thereof, the read process of the state of the memory-diode provides a current level therethrough which is other than substantially zero.

14. The method of claim 1 wherein the read process is capable of providing first and second levels of voltage applied to the memory-diode in the forward direction of the memory-diode.

15. The method of claim 14 wherein the first voltage is of a lower level than a selected threshold voltage of the memory-diode, and wherein the second voltage is of a higher level then the selected threshold voltage of the memory-diode.

16. The method of claim 15 wherein the read process is capable of providing a third level of voltage applied to the memory-diode in the forward direction of the memory-diode.

17. A method of undertaking a procedure on a conductive memory-diode comprising:
   providing a first threshold voltage for the memory-diode;
   applying a read current of a selected magnitude through the memory-diode in the forward direction of the memory-diode;
   providing a second threshold voltage for the memory-diode, different from the first threshold voltage; and
   applying a read current of said selected magnitude through the memory-diode in the forward direction of the memory-diode.

18. The method of claim 17 wherein at least one of the first and second threshold voltages for the memory-diode is determined by applying an electrical potential across the memory-diode from higher to lower potential in the reverse direction of the memory-diode.

19. The method of claim 17 wherein the first and second threshold voltages for the memory-diode are determined by applying different respective electrical potentials across the memory-diode from higher to lower potential in the reverse direction of the memory-diode.

20. A method of undertaking a procedure on a conductive memory-diode comprising:
   providing a first threshold voltage for the memory-diode;
   applying an electrical potential of a selected magnitude across the memory-diode from higher to lower potential in the forward direction of the memory-diode;
   providing a second threshold voltage for the memory-diode, different from the first threshold voltage; and
   applying the electrical potential of said selected magnitude across the memory-diode from higher to lower potential in the forward direction of the memory-diode.

21. The method of claim 20 wherein the steps of applying an electrical potential of a selected magnitude across the memory-diode from higher to lower potential in the forward direction of the memory-diode are read processes.

22. The method of claim 20 wherein at least one of the first and second threshold voltages for the memory-diode is determined by applying an electrical potential across the memory-diode from higher to lower potential in the reverse direction of the memory-diode.

23. The method of claim 20 wherein the first and second threshold voltages for the memory-diode are determined by applying different respective electrical potentials across the memory-diode from higher to lower potential in the reverse direction of the memory-diode.

24. A method of undertaking a procedure on first and second memory-diodes comprising:
   selecting a forward direction threshold voltage of the first memory-diode; and
   selecting a forward direction threshold voltage of the second memory-diode, the selected threshold voltage of the first memory-diode being different from the selected threshold voltage of the second memory-diode, and further comprising reading the state of each of the first and second memory-diodes, wherein reading the state of each of the first and second memory-diodes comprises applying a read electrical potential of substantially the same magnitude across each memory-diode from higher to lower potential in the forward direction thereof.

25. The method of claim 24 wherein the step of selecting the threshold voltage of the first memory-diode comprises applying an electrical potential to the first memory-diode from higher to lower potential in the reverse direction of the memory-diode, and wherein the step of selecting the threshold value of the second memory-diode comprises applying an electrical potential to the second memory-diode from higher to lower potential in the reverse direction of the memory-diode, the electrical potential applied to the first memory-diode being different from the electrical potential applied to the second memory-diode.

26. A method of undertaking a procedure on first and second memory-diodes comprising:
   selecting a forward direction threshold voltage of the first memory-diode; and
   selecting a forward direction threshold voltage of the second memory-diode, the selected threshold voltage of the first memory-diode being different from the selected threshold voltage of the second memory-diode, and further comprising reading the state of each of the first and second memory-diodes, wherein reading the state of each of the first and second memory-diodes comprises applying a first electrical potential of a first level across each memory-diode from higher to lower potential in the forward direction thereof, and applying a second electrical potential of a second level greater than the first level across at least one of the memory-diodes from higher to lower potential in the forward direction thereof.

27. The method of claim 26 wherein the step of selecting the threshold voltage of the first memory-diode comprises applying an electrical potential to the first memory-diode from higher to lower potential in the reverse direction of the memory-diode, and wherein the step of selecting the threshold value of the second memory-diode comprises applying an electrical potential to the second memory-diode from higher to lower potential in the reverse direction of the memory-diode, the electrical potential applied to the first memory-diode being different from the electrical potential applied to the second memory-diode.

28. A method of undertaking a procedure on first and second memory-diodes comprising:
   selecting a forward direction threshold voltage of the first memory-diode; and
   selecting a forward direction threshold voltage of the second memory-diode, the selected threshold voltage of the first memory-diode being different from the selected threshold voltage of the second memory-diode, and further comprising reading the state of each of the first and second memory-diodes, wherein reading the state of each of the first and second memory-diodes comprises applying a read current of substantially the same magnitude through each memory-diode in the forward direction thereof, wherein the step of selecting the threshold voltage of the first memory-diode comprises applying an electrical potential to the first memory-diode from higher to lower potential in the reverse direction of the memory-diode, and wherein the step of selecting the threshold value of the second memory-diode comprises applying an electrical potential to the second memory-diode from higher to lower potential in the reverse direction of the memory-diode, the electrical potential applied to the first memory-diode being different from the electrical potential applied to the second memory-diode.

29. A memory structure comprising a first memory device comprising a pair of electrodes and an active layer therebetween, the first memory device having a selected first threshold voltage, and a second memory device comprising a pair of electrodes and an active layer therebetween, the second memory device having a selected second threshold voltage, the first threshold voltage being different from the second threshold voltage.

30. The memory structure of claim 29 and further comprising a third memory device comprising a pair of electrodes and an active layer therebetween and having a third threshold voltage, the first, second and third threshold voltages being different from each other.

31. The memory structure of claim 30 and further comprising a fourth memory device comprising a pair of electrodes and an active layer therebetween and having a fourth threshold voltage, the first, second, third and fourth threshold voltages being different from each other.

32. A memory array comprising;
a first plurality of conductors;
a second plurality of conductors, and;
a plurality of memory-diodes, each connecting a conductor of the first plurality thereof with a conductor of the second plurality thereof, wherein a first memory-diode of the plurality thereof has a selected first threshold voltage, and a second memory-diode of the plurality thereof has a selected second threshold voltage different from the first threshold voltage.

33. The memory array of claim 32 and further wherein a third memory-diode of the plurality thereof has a third threshold voltage, the first, second and third threshold voltages being different from each other.

34. The memory array of claim 33 and further wherein a fourth memory-diode of the plurality thereof has a fourth threshold voltage, the first, second, third and fourth threshold voltages being different from each other.

35. A method of undertaking a procedure on a memory-diode comprising:
providing a memory-diode having a threshold voltage; and
tracking variation of the threshold voltage of the memory-diode;
further comprising undertaking a read process of the memory-diode, and varying the read process in response to tracking of the variation of the threshold voltage.

36. The method of claim 35 wherein the threshold voltage of the memory-diode is determined by applying an electrical potential across the memory-diode from higher to lower potential in the reverse direction of the memory-diode.

37. The method of claim 35 wherein the variation of the threshold voltage is time-dependent.

* * * * *